United States Patent
Oikawa

(10) Patent No.: US 7,428,654 B2
(45) Date of Patent: Sep. 23, 2008

(54) DATA TRANSFER CIRCUIT FOR TRANSFERRING DATA BETWEEN A FIRST CIRCUIT BLOCK AND A SECOND CIRCUIT BLOCK

(75) Inventor: Kohei Oikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 368 days.

(21) Appl. No.: 11/373,113

(22) Filed: Mar. 13, 2006

(65) Prior Publication Data

US 2007/0075730 A1 Apr. 5, 2007

(30) Foreign Application Priority Data

Oct. 5, 2005 (JP) ............................. 2005-292341

(51) Int. Cl.
*G06F 1/12* (2006.01)
(52) U.S. Cl. .................... 713/400; 713/501; 713/503
(58) Field of Classification Search ................. 713/400, 713/401, 500, 501, 502, 503
See application file for complete search history.

(56) References Cited

U.S. PATENT DOCUMENTS 5,841,298 A 11/1998 Huang
6,931,561 B2 * 8/2005 Carpenter et al. ........... 713/400
7,093,144 B2 * 8/2006 Skroch ........................ 713/300
7,161,999 B2 * 1/2007 Parikh ......................... 375/354
2006/0020836 A1 1/2006 Oikawa

FOREIGN PATENT DOCUMENTS

JP 2004-217873 8/2004

OTHER PUBLICATIONS

W.J. Bainbridge, et al., "Delay Insensitive System-on-Chip Interconnect using 1-of-4 Data Encoding", Proc. Async, Apr. 2001, pp. 118-126.

* cited by examiner

*Primary Examiner*—Rehana Perveen
*Assistant Examiner*—Paul B Yanchus, III
(74) *Attorney, Agent, or Firm*—Oblon, Spivak, McClelland, Maier & Neustadt, P.C.

(57) ABSTRACT

A data transfer circuit includes a first transfer circuit receiving the first transfer signal, a second transfer circuit receiving the second transfer signal, a third transfer circuit receiving the first transfer signal and an inverted first transfer signal from the first transfer circuit and transferring the first transfer signal in response to a reply signal, a fourth transfer circuit receiving the second transfer signal and an inverted second transfer signal from the second transfer circuit and transferring the second transfer signal in response to the reply signal.

19 Claims, 7 Drawing Sheets

DATA TRANSFER CIRCUIT FOR TRANSFERRING DATA BETWEEN A FIRST CIRCUIT BLOCK AND A SECOND CIRCUIT BLOCK

CROSS REFERENCE TO RELATED APPLICATIONS AND INCORPORATION BY REFERENCE

This application is based upon and claims the benefit of priority from prior Japanese Patent Application P2005-292341 filed on Oct. 5, 2005; the entire contents of which are incorporated by reference herein.

BACKGROUND OF THE INVENTION

1. Field of the Invention

The present invention relates to a semiconductor integrated circuit in which data is transferred between circuit blocks having different power supply voltage and clock frequency.

2. Description of the Related Art

With recent semiconductor integrated circuit design, manufacturing a circuit to have high performance and low power consumption is a significant concern. According to a lower power circuit configuration method, a semiconductor integrated circuit is divided into a plurality of circuit blocks differing from one another in power supply voltage and clock frequency so as to optimize performance and power consumption of the semiconductor integrated circuit. The above method has a problem in that transferring data between circuit blocks differing in clock frequency is necessary. Furthermore, clock skew between the circuit blocks differing in clock frequency is also a problem. To resolve these problems, a 'globally asynchronous locally synchronous (GALS) method' of connecting the circuit blocks differing in clock frequency via an asynchronous bus is proposed.

In general, an asynchronous bus connecting first and second circuit blocks differing from each other in clock frequency includes a data transfer circuit for transferring data therebetween. More specifically, a data signal transferred from the first circuit block is transferred to the data transfer circuit in synchronization with a first clock frequency set to the first circuit block. The data signal transferred to the data transfer circuit is transferred to the second circuit block in synchronization with a second clock frequency set to the second circuit block. When the data signal is transferred to the second circuit block, the second circuit block transfers, to the first circuit block via the data transfer circuit, a reply signal indicating that the data signal has been transferred.

A data transfer path from the first circuit block to the second circuit block, through which the data signal is transferred, and a path from the second circuit block to the first circuit block, through which the reply signal is transferred, are hereafter referred to as a 'transfer loop'.

Throughput of data transfer via the data transfer circuit is dependent on the duration time that the data signal and the reply signal transfer through the transfer loop. In other words, if the transfer loop is long, data transfer time via the data transfer circuit increases, thereby decreasing the throughput. If the transfer loop is short, throughput of data transfer via the data transfer circuit improves. Accordingly, shortening the transfer loop is important for improving performance of a semiconductor integrated circuit having a plurality of circuit blocks that differ in clock frequency.

Generally, signal levels of the circuit blocks differ between circuit blocks that differ in power supply voltage. Therefore, when the power supply voltage for a first circuit block differs from the power supply voltage for a second circuit block, a level converter for converting the level of the data signal from an internal signal level of the first circuit block to an internal signal level of the second circuit block, and a level converter for converting the level of the reply signal from the internal signal level of the second circuit block to the internal signal level of the first circuit block are required to be provided within the transfer loop. As a result, the transfer loop becomes longer, and the data transfer throughput decreases. In other words, impaired performance of the semiconductor integrated circuit occurs.

SUMMARY OF THE INVENTION

An aspect of the present invention inheres in a data transfer circuit configured to transfer data between a first circuit block and a second circuit block, the second circuit block operating at a power supply voltage different from a power supply voltage for the first circuit block. The data transfer circuit includes a first transfer circuit configured to receive a first transfer signal from the first circuit block; a second transfer circuit configured to receive a second transfer signal from the first circuit block; a third transfer circuit configured to receive the first transfer signal transmitted from the first transfer circuit, and an inverted first transfer signal from the first transfer circuit, and transfer the first transfer signal to the second circuit block in response to a reply signal from the second circuit block; and a fourth transfer circuit configured to receive the second transfer signal transmitted from the second transfer circuit, and an inverted second transfer signal from the second transfer circuit, and transfer the second transfer signal to the second circuit block in response to the reply signal. A transfer control signal is generated using the first transfer signal and the inverted first transfer signal, both of which are transferred from the third transfer circuit, and the second transfer signal and the inverted second transfer signal, both of which are transferred from the fourth transfer circuit. The first transfer circuit transmits the first transfer signal and the inverted first transfer signal in response to the transfer control signal; the second transfer circuit transmits the second transfer signal and the inverted second transfer signal in response to the transfer control signal; and a reply signal is generated to be transferred to the first circuit block using the inverted first transfer signal transmitted from the first transfer circuit and the inverted second transfer signal transmitted from the second transfer circuit.

DETAILED DESCRIPTION OF THE INVENTION

Figure 1:
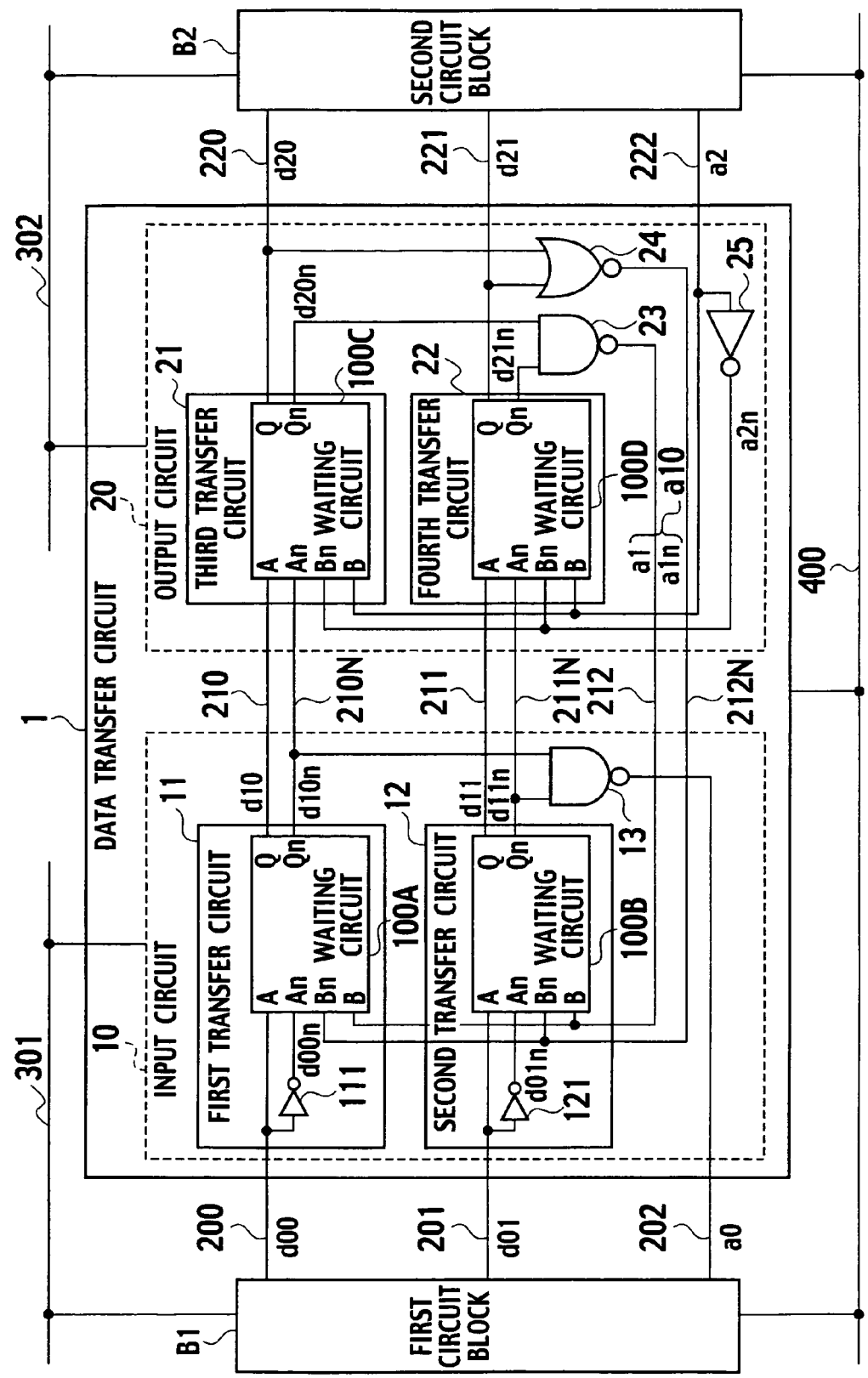
FIG. 1 is a schematic diagram showing a data transfer circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

A data transfer circuit 1 shown in FIG. 1, according to a first embodiment of the present invention, transfers data between a first circuit block B1 and a second circuit block B2, the circuit blocks B1 and B2 differing from each other in power supply voltage.

The data transfer circuit 1 includes a first transfer circuit 11, a second transfer circuit 12, a third transfer circuit 21 and a fourth transfer circuit 22. The first transfer circuit 11 receives a first transfer signal d00 transmitted from the first circuit block B1. The second transfer circuit 12 receives a second transfer signal d01 transmitted from the first circuit block B1.

The third transfer circuit 21 receives a first transfer signal d10 transmitted from the first circuit block 11 and the first transfer circuit 11. The third transfer circuit 21 receives an inverted signal d10n of the first transfer signal d10 transmitted from the first transfer circuit 11. The third transfer circuit 21 transmits a first transfer signal d20 in response to a reply signal a2 transmitted from the second circuit block B2.

The fourth transfer circuit 22 receives a second transfer signal d11 transmitted from the first transfer circuit 11 and the second transfer circuit 12. The fourth transfer circuit 22 receives an inverted signal d11n of the second transfer signal d11 transmitted from the second transfer circuit 12. The fourth transfer circuit 22 transmits a second transfer signal d21 in response to the reply signal a2 from the second circuit block B2.

The first transfer circuit 11 transmits the first transfer signal d10 and the inverted signal d10n of the first transfer signal d10 in response to a transfer control signal a10 generated from the first transfer signal d20 and the inverted signal d20n thereof, and the second transfer signal d21 and the inverted signal d21n thereof, which are transmitted from the third transfer circuit 21 and the fourth transfer circuit 22, respectively. The second transfer circuit 12 transmits the second transfer signal d11 and the inverted signal d11n thereof in response to the transfer control signal a10. The input circuit 10 generates a reply signal a0 to be transmitted to the first circuit block B1 using the inverted signal d10n of the first transfer signal d10 transmitted from the first transfer circuit 11 and the inverted signal d11n of the second transfer signal d11 transmitted form the second transfer circuit 12.

The first circuit block B1 is connected to a first high voltage power supply line 301 or a voltage Vd1 and a low voltage power supply line 400 or a voltage Vss. The second circuit block B2 is connected to a second high voltage power supply line 302 or a voltage Vd2 and the low voltage power supply line 400. Here, a high level for the internal signal of the first circuit block B1 is set to the voltage Vd1, and a low level is set to the voltage Vss. Therefore, the high level for the first transfer signal d00 and the second transfer signal d01 transmitted from the first circuit block B1 is the voltage Vd1, respectively, and the low level is the voltage Vss. Furthermore, the high level for the internal signal of the second circuit block B2 is set to the voltage Vd2, and the low level is set to the voltage Vss. Therefore, the high level for the first transfer signal d20 and the second transfer signal d21 received by the second circuit block B2 needs to be the voltage Vd2 and the low level needs to be the voltage Vss.

When the first circuit block B1 and the second circuit block B2 operate at different clock frequencies, or when either one or both of the first circuit block B1 and the second circuit block B2 are asynchronous circuits not operating in synchronization with the clock signal, the data transfer circuit 1 is a part of an asynchronous bus connecting the first circuit block B1 and the second circuit block B2, differing in power supply voltage, and converts the level of a signal to be transferred therebetween.

As shown in FIG. 1, the data transfer circuit 1 includes an input circuit 10, which includes the first transfer circuit 11 and the second transfer circuit 12, and an output circuit 20, which includes the third transfer circuit 21 and the fourth transfer circuit 22.

The first transfer circuit 11 includes a waiting circuit 100A and an inverter 111. The first transfer signal d00 transferred to the first transfer circuit 11 via the interconnect 200 enters the waiting circuit 100A and the inverter 111. The inverted signal d00n of the first transfer signal d00 transmitted by the inverter 111 enters the waiting circuit 100A. The first transfer signal d10 and the inverted signal d10n thereof are respectively transferred to the third transfer circuit 21 from the waiting circuit 100A via the interconnect 210 and the interconnect 210N.

The second transfer circuit 12 includes a waiting circuit 100B and an inverter 121. The second transfer signal d01 transferred to the second transfer circuit 12 via the interconnect 201 enters the waiting circuit 100B and the inverter 121. The inverted signal d01n of the second transfer signal d01 transmitted by the inverter 121 enters the waiting circuit 100B. The second transfer signal d11 and the inverted signal d11n thereof are respectively transferred to the fourth transfer circuit 22 from the waiting circuit 100B via the interconnect 211 and the interconnect 211N.

The input circuit 10 further includes a NAND circuit 13. The inverted signal d10n is transferred from the waiting circuit 100A to the NAND circuit 13, and the inverted signal d11n is transferred from the waiting circuit 100B to the NAND circuit 13. The NAND circuit 13 transfers the reply signal a0 to the first circuit block B1 via the interconnect 202.

The input circuit 10 is connected to the first high voltage power supply line 301 and the low voltage power supply line 400. The input circuit 10 operates in synchronization with the first circuit block B1. The output circuit 20 is connected to the second high voltage power supply line 302 and the low voltage power supply line 400. The output circuit 20 operates in synchronization with the second circuit block B2.

The third transfer circuit 21 includes a waiting circuit 100C. The inverted signal d10n of the first transfer signal d10 transferred from the first transfer circuit 11 enters the waiting circuit 100C. The first transfer signal d20 is transferred from the waiting circuit 100C to the second circuit block B2 via the interconnect 220.

The fourth transfer circuit 22 includes a waiting circuit 100D. The second transfer signal d11 and the inverted signal d11n transferred from the second transfer circuit 12 enter the waiting circuit 100D. The second transfer signal d21 is transferred from the waiting circuit 100D to the second circuit block B2 via the interconnect 221.

The output circuit 20 further includes a NAND circuit 23, a NOR circuit 24, and an inverter 25.

The inverted signal d20n of the first transfer signal d20 is transferred from the waiting circuit 100C to the NAND circuit 23, and the inverted signal d21n of the second transfer signal d21 is transferred from the waiting circuit 100D to the NAND circuit 23. The NAND circuit 23 transfers a signal a1 to the input circuit 10.

The first transfer signal d20 is transferred from the waiting circuit 100C to the NOR circuit 24, and the transfer signal d21 is transferred from the waiting circuit 100D to the NOR circuit 24. The NOR circuit 24 transfers an inverted signal a1n to the input circuit 10. The inverted signal a1n is an inverted signal of the signal a1, and the transfer control signal a10 includes the signal a1 and the inverted signal a1n.

The reply signal a2 transferred from the second circuit block B2 to the output circuit 20 via the interconnect 222 enters the waiting circuit 100C, the waiting circuit 100D, and the inverter 25. An inverted signal a2n of the reply signal a2 transmitted by the inverter 25 enters the waiting circuit 100C and the waiting circuit 100D.

Figure 2:
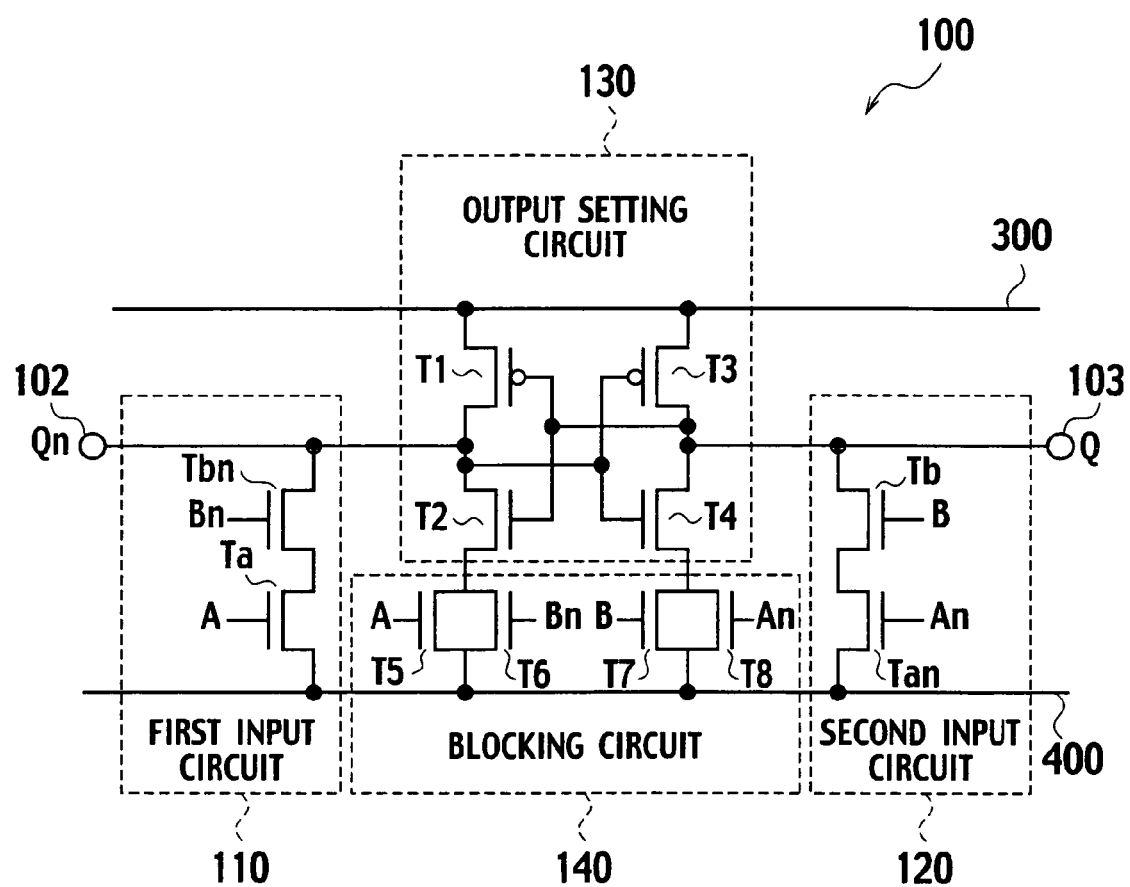
FIG. 2 is a schematic diagram showing a waiting circuit of a data transfer circuit according to the first embodiment of the present invention.

The waiting circuits 100A through 100D included in the first transfer circuit 11, the second transfer circuit 12, the third transfer circuit 21, and the fourth transfer circuit 22, respectively, may employ a waiting circuit 100 shown in FIG. 2. The waiting circuit 100 shown in FIG. 2 will be described before describing the operation of the data transfer circuit 1.

As shown in FIG. 2, the waiting circuit 100 includes a first input circuit 110, a second input circuit 120, and an output setting circuit 130. The first input circuit 110 includes a cascaded first input transistor Ta, which receives an input signal A, and a first negative input transistor Tbn, which receives an input signal Bn. The second input circuit 120 includes a cascaded second negative input transistor Tan, which receives an input signal An or an inverted signal of the input signal A, and a second input transistor Tb, which receives an input signal B or an inverted signal of the input signal Bn. The output setting circuit 130 sets the level of an output signal in accordance with the conductive status of the first input circuit 110 and the second input circuit 120. Here, channels for the first input transistor Ta, the first negative input transistor Tbn, the second input transistor Tb, and the second negative input transistor Tan are all of the same conductivity type. FIG. 2 shows an example where the first input transistor Ta, the second input transistor Tb, the second negative input transistor Tan, and the first negative input transistor Tbn are n-channel MOS transistors (hereafter referred to as 'nMOS transistors').

As shown in FIG. 2, the first input circuit 110 is connected to an output terminal 102 and the low voltage power supply line 400. More specifically, the source electrode of the first input transistor Ta is connected to the low voltage power supply line 400, and the drain electrode is connected to the drain electrode of the first negative input transistor Tbn. The input signal A enters the gate electrode of the first input transistor Ta. The input signal Bn enters the gate electrode of the first negative input transistor Tb, and the output terminal 102 is connected to the source electrode.

The second input circuit 120 is connected to an output terminal 103 and the low voltage power supply line 400. More specifically, the source electrode of the second negative input transistor Tan is connected to the low voltage power supply line 400, and the drain electrode is connected to the drain electrode of the second input transistor Tb. The input signal An enters the gate electrode of the second negative input transistor Tan. The input signal B enters the gate electrode of the second input transistor Tb, and the output terminal 103 is connected to the source electrode.

As described later, the input signal A is either the first transfer signal d00, the first transfer signal d10, the second transfer signal d01, or the second transfer signal d11. The input signal Bn is either the inverted signal a2n of the reply signal a2 or the inverted signal a1n of the signal a1. The input signal An is either the inverted signal d10n, the inverted signal d01n, or the inverted signal d11n. The input signal B is either the reply signal a2 or the signal a1.

The output setting circuit 130 includes a first setting transistor T1 with a first conductivity type channel, a second setting transistor T2 with a second conductivity type channel, a third setting transistor T3 with the first conductivity type channel, and a fourth setting transistor T4 with the second conductivity type channel. The first setting transistor T1 has the drain electrode connected to the first input circuit 110 and the gate electrode connected to the second input circuit 120. The second setting transistor T2 has the drain electrode connected to the first input circuit 110 and the gate electrode connected to the second input circuit 120. The third setting transistor T3 has the gate electrode connected to the first input circuit 110 and the drain electrode connected to the second input circuit 120. The fourth setting transistor T4 has the gate electrode connected to the first input circuit 110 and the drain electrode connected to the second input circuit 120.

The source electrodes of the first setting transistor T1 and the second setting transistors T2 are connected to a power supply line 300. FIG. 2 shows an example where the first setting transistor T1 and the third setting transistor T3 are p-channel MOS transistors (hereafter referred to as 'pMOS transistors'), and the second setting transistor T2 and the fourth setting transistor T4 are nMOS transistors. An output signal Q is transmitted from the output terminal 103, and an output signal Qn as an inverted signal of the output signal Q is transmitted from the output terminal 102.

The output setting circuit 130 shown in FIG. 2 further includes a blocking circuit 140. The blocking circuit 140 includes fifth through eight setting transistors T5 through T8. The channel of the fifth setting transistor T5 is of the same conductivity type as the first input transistor Ta, and FIG. 2 shows an example where the fifth setting transistor T5 is an NMOS transistor. The drain electrode of the fifth setting transistor T5 is connected to the source electrode of the second setting transistor T2, and the source electrode is connected to the low voltage power supply line 400. The input signal A enters the gate electrode of the fifth input transistor T5.

The channel of the sixth setting transistor T6 is of the same conductivity type as the first negative input transistor Tbn, and FIG. 2 shows an example where the sixth setting transistor T6 is an NMOS transistor. The drain electrode of the sixth setting transistor T6 is connected to the source electrode of the second setting transistor T2, and the source electrode is connected to the low voltage power supply line 400. The input signal Bn enters the gate electrode of the sixth input transistor T6.

The channel of the seventh setting transistor T7 is of the same conductivity type as the second input transistor Tb, and FIG. 2 shows an example where the seventh setting transistor T7 is an RMOS transistor. The drain electrode of the seventh setting transistor T7 is connected to the source electrode of the fourth setting transistor T4, and the source electrode is connected to the low voltage power supply line 400. The input signal B enters the gate electrode of the seventh input transistor T7.

The channel of the eighth setting transistor T8 is of the same conductivity type as the second negative input transistor Tan, and FIG. 2 shows an example where the eighth setting transistor T8 is an nMOS transistor. The drain electrode of the eighth setting transistor T8 is connected to the source electrode of the fourth setting transistor T4, and the source electrode is connected to the low voltage power supply line 400. The input signal An enters the gate electrode of the eighth input transistor T8.

Figure 3:
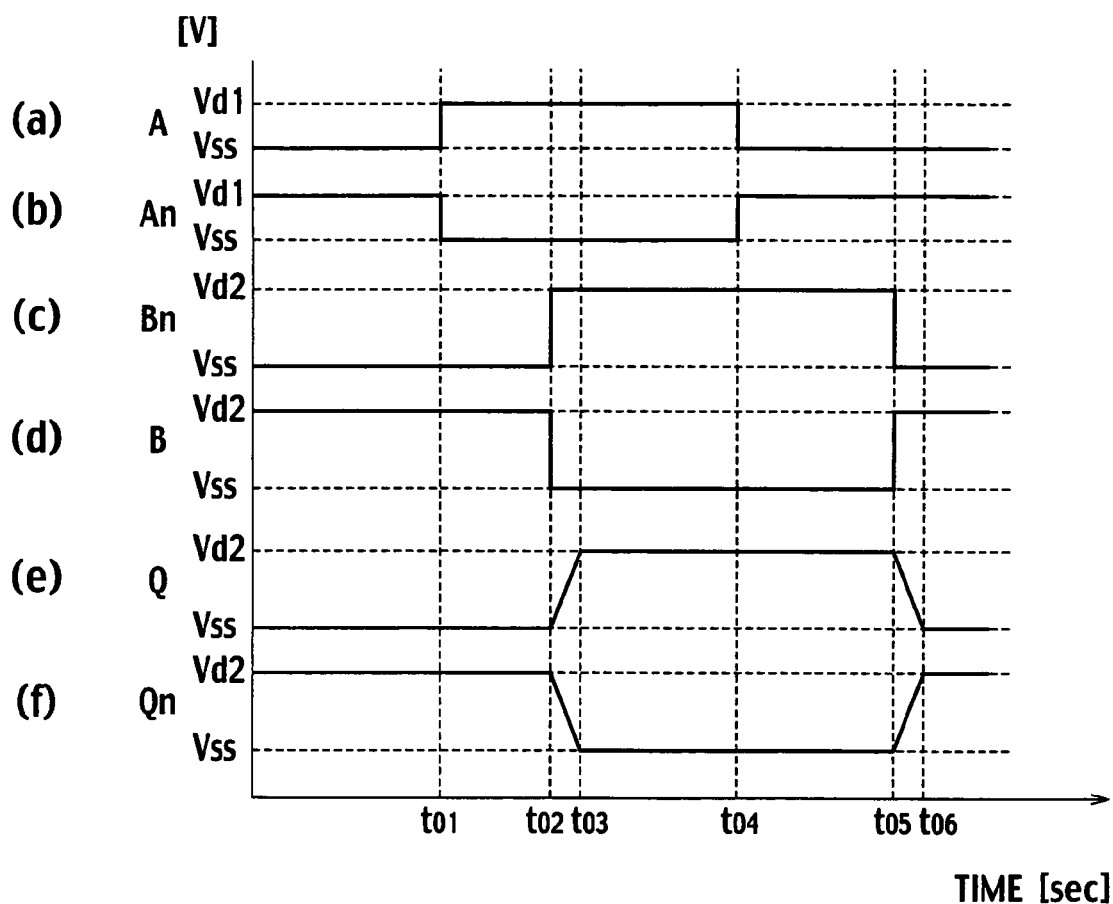
FIG. 3 is a timing chart explaining an operation of the waiting circuit shown in FIG. 2.

An operation of the waiting circuit 100 is described with reference of a timing chart of FIG. 3. In the following description, the high level for the input signal A and the input signal An is set to the voltage Vd1, and the low level is set to the voltage Vss. Furthermore, the high level for the input signal B and the input signal Bn is set to the voltage Vd2, and the low level is set to the voltage Vss. Here, the voltage Vd1 is assumed to be lower than the voltage Vd2. Moreover, the voltage of the power supply line 300 is assumed to be the voltage Vd2.

(a) At time t01, the input signal A changes from the low level to the high level, and the input signal An changes from the high level to the low level.

(b) At time t02, the input signal Bn changes from the low level to the high level, and the input signal B changes from the high level to the low level. As a result, the first input transistor Ta and the first negative input transistor Tbn turn on, and the first input circuit 110 enters a conductive state. A current flows from the output terminal 102 to the low voltage power source line 400, changing the output signal Qn from the high level to the low level. Meanwhile, the second negative input transistor Tan and the second input transistor Tb turn off, and the second input circuit 120 enters an intercept state. A current can no longer flow from the output terminal 103 to the low voltage power source line 400, changing the output signal Q from the low level to the high level. As a result, at time t03, the level of the output signal Q is the voltage Vd2 and the level of the output signal Qn is the voltage Vss.

(c) At time t04, the input signal A changes from the high level to the low level, and the input signal An changes from the low level to the high level.

(d) At time t05, the input signal Bn changes from the high level to the low level, and the input signal B changes from the low level to the high level. As a result, the first input transistor Ta and the first negative input transistor Tbn turn off, and the first input circuit 110 enters an intercept state. The current can no longer flow from the output terminal 102 to the low voltage power source line 400, changing the output signal Qn from the low level to the high level. Meanwhile, the second negative input transistor Tan and the second input transistor Tb turn on, and the second input circuit 120 enters a conductive state. A current flows from the output terminal 103 to the low voltage power source line 400, changing the output signal Q from the high level to the low level. As a result, at time t06, the level of the output signal Q is the voltage Vss and the level of the output signal Qn is the voltage Vd2.

As described above, in the waiting circuit 100, after the level of the input signal A and the input signal An has changed, the output signal Q and the output signal Qn change when the input signal B and the input signal Bn have changed.

When the input signal A and the input signal Bn are both at the high level, namely when the first input circuit 110 is in a conductive state, the output signal Q changes to the high level and the output signal Qn changes to the low level. When the input signal A and the input signal Bn are both at the low level, namely when the second input circuit 120 is in a conductive state, the output signal Q changes to the low level and the output signal Qn changes to the high level. When the levels of the input signal A and the input signal Bn differ, the levels of the output signal Q and the output signal Qn do not change.

The voltage of the power supply line 300 is the voltage Vd2 of the high voltage power supply line 302 in the example described above. Therefore, the high level of the output signal Q and the output signal Qn is the voltage Vd2. When the voltage of the power source line 300 is the voltage Vd1 of the first high voltage power source line 301, the high level for the output signal Q and the output signal Qn is the voltage Vd1. As already mentioned, channels for the first input transistor Ta, the first negative input transistor Tbn, the second input transistor Tb, and the second negative input transistor Tan are all the same conductivity type. In the waiting circuit 100 shown in FIG. 2, the first input transistor Ta, the second input transistor Tb, the second negative input transistor Tan, and the first negative input transistor Tbn are nMOS transistors. Therefore, the high level for the input signals A, An, B, and Bn need not be equivalent to the voltage of the power source line 300. In other words, regardless of the high level voltage of the input signals A, An, B, and Bn, the high levels for the output signal Q and the output signal Qn of the waiting circuit 100 are determined as the voltage of the power supply line 300.

Since the output setting circuit 130 includes the blocking circuit 140, a leakage current, which flows from the output terminal 103 or the output terminal 102 to the low voltage power source line 400 when the voltage of either the output terminal 103 or the output terminal 102 at a high level, is reduced. For example, when both the input signal A and the input signal Bn are at the low level, the voltage of the output terminal 102 is at the high level. Since the fifth setting transistor T5 and the sixth setting transistor T6 turn off in such case, a leakage current, which flows from the output terminal 102 to the low voltage power source line 400 via the second setting transistor T2, is reduced. When both the input signal An and the input signal B are at the low level, the seventh setting transistor T7 and the eighth setting transistor T8 turn off. Therefore, a leakage current, which flows from the output terminal 103 to the low voltage power source line 400 via the fourth setting transistor T4, is reduced. As a result, a transition period for when either the output terminal 103 or the output terminal 102 changes from the low level to the high level becomes shorter.

In the case where the waiting circuit 100 shown in FIG. 2 is applied as the waiting circuit 100A shown in FIG. 1, the input signal A corresponds to the first transfer signal d00, the input signal An corresponds to the inverted signal d00n, the input signal B corresponds to the signal a1, and the input signal Bn corresponds to the inverted signal a1n of the signal a1. The output signal Q corresponds to the first transfer signal d10 and the output signal Qn corresponds to the inverted signal d10n.

In the case where the waiting circuit 100 is applied as the waiting circuit 100B, the input signal A corresponds to the second transfer signal d01, the input signal An corresponds to the inverted signal d01n, the input signal B corresponds to the signal a1, and the input signal Bn corresponds to the inverted signal a1n. The output signal Q corresponds to the second transfer signal d11 and the output signal Qn corresponds to the inverted signal d11n.

In the case where the waiting circuit 100 is applied as the waiting circuit 100C, the input signal A corresponds to the first transfer signal d10, the input signal An corresponds to the inverted signal d10n, the input signal B corresponds to the signal a2, and the input signal Bn corresponds to the inverted signal a2n. The output signal Q corresponds to the first transfer signal d20 and the output signal Qn corresponds to the inverted signal d20n.

In the case where the waiting circuit 100 is applied as the waiting circuit 100D, the input signal A corresponds to the second transfer signal d11, the input signal An corresponds to the inverted signal d11n, the input signal B corresponds to the signal a2, and the input signal Bn corresponds to the inverted signal a2n. The output signal Q corresponds to the second transfer signal d21 and the output signal Qn corresponds to the inverted signal d21n.

In the case where the waiting circuit 100 is applied as either the waiting circuit 100A or the waiting circuit 100B, the power source line 300 shown in FIG. 2 corresponds to the first high voltage power source line 301 shown in FIG. 1. In the case where the waiting circuit 100 is applied as either the waiting circuit 100C or the waiting circuit 100D, the power source line 300 shown corresponds to the second high voltage power source line 302 shown in FIG. 1.

Next, an operation of the data transfer circuit 1 shown in FIG. 1 is described. The data transfer circuit 1 transfers 1-bit long data from the first circuit block B1 to the second circuit block B2 via the first transfer signal d00 and the second transfer signal d01. More specifically, data is transferred from the first circuit block B1 to the second circuit block B2 utilizing the change in level L00 of the first transfer signal d00 and the change in level L01 of the second transfer signal d01.

When a combination of level L00 and level L01 is denoted as level [L00, L01], the data transferred from the first circuit block B1 to the second circuit block B2 is represented as follows. Level [1, 0], level [0, 1], and level [0, 0] are represented as 'data=0', 'data=1', and 'no data', respectively. Here, L00=1 indicates that level L00 is the high level, and L00=0 indicates that level L00 is the low level. 'No data' is a state where data is not transferred from the first circuit block B1 to the second circuit block B2. For example, by changing level [0, 0] to level [1, 0], to level [0, 0], and then to level [0, 1], data transfer with 'no data' to 'data=0' to 'no data' and to 'data=1' is executed.

When data is transferred from the first circuit block B1 to the second circuit block B2, a reply signal a2 notifying that data has been transferred to the second circuit block B2 is transferred to the first circuit block B1 from the second circuit block B2. The reply signal a2 is transferred as a transfer control signal a10 from the second circuit block B2 to the data transfer circuit 1, and transferred as a reply signal a0 from the data transfer circuit 1 to the first circuit block B1.

In the case of changing level [0, 0] to level [1, 0], to level [0, 0], and then to level [0, 1], data transfer including the reply signal a2 is as follows:

'no data' and 'a2=0' to 'data=0' and 'a2=0', to 'data=0' and 'a2=1', to 'no data' and 'a2=1', and then to 'no data' and 'a2=0'.

Figure 4:
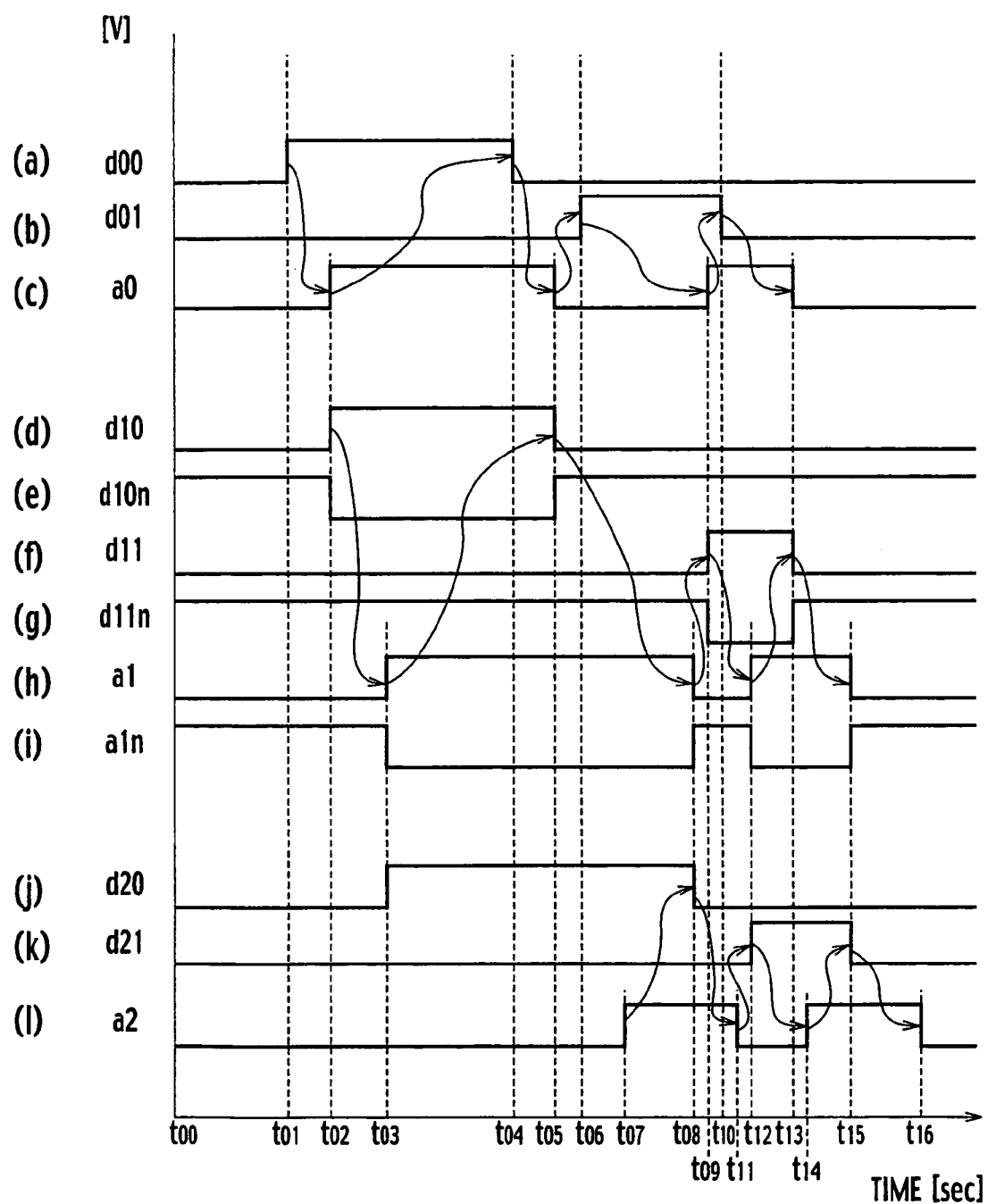
FIG. 4 is a timing chart explaining an operation of the data transfer circuit according to the first embodiment of the present invention.

Exemplary data transfer by the data transfer circuit 1 is described with a timing chart shown in FIG. 4. FIG. 4 shows a timing chart for the case where 'data=0' and 'data=1' are successively transferred from the first circuit block B1 to the second circuit block B2. Note that at time t0, the input signal a2 and the signal a1 are at a low level.

(a) At time t1, the first transfer signal d00 is at the high level and the second transfer signal d01 is at the low level, and 'data=0' is transferred from the first circuit block B1. Since the first transfer signal d00 changes to the high level with the signal a1 being at the low level and the inverted signal a1n at the high level, the output signal Q of the waiting circuit 100A changes to the high level and the output signal Qn changes to the low level. In other words, the first transfer signal d01 changes to the high level and the inverted signal d10n changes to the low level at time t2. Meanwhile, since the second transfer signal d01 is at the low level, the output signal Q of the waiting circuit 100B changes to the low level and the output signal Qn changes to the high level. In other words, the second transfer signal d11 is at the low level and the inverted signal d11n is at the high level. As a result, the reply signal a0 changes to the high level at the time t2.

(b) At time t2, the first transfer signal d10 changes to the high level with the reply signal a2 being at the low level. Therefore, the output signal Q of the waiting circuit 100C changes to the high level and the output signal Qn changes to the low level. In other words, at the time t3, the first transfer signal d20 changes to the high level. Meanwhile, since the second transfer signal d11 is at the low level and the inverted signal d11n is at the high level, the output signal Q of the waiting circuit 100D changes to the low level and the output signal Qn changes to the high level. In other words, the second transfer signal d21 is at the low level and the inverted signal d21n is at the high level. As a result, the signal al changes to the high level and the inverted signal a1n changes to the low level at the time t3.

(c) At time t4, the first transfer signal d00 changes to the low level. In other words, the time periods t1 through t4 define a period during which 'data=0' is transferred from the first circuit block B1. Since the first transfer signal d00 changes to the low level with the signal a1 being at the high level and the inverted signal a1n being at the low level, the first transfer signal d10 changes to the low level and the inverted signal d10n changes to the high level at time t5. In other words, the time periods t2 through t5 define a period during which 'data=0' is transferred from the input circuit 10. At the time t5, the reply signal a0 changes to the low level.

(d) At time t6, the second transfer signal d01 changes to the high level with the first transfer signal d00 being at the low level, and 'data=1' is transferred from the first circuit block B1. Since the second transfer signal d01 changes to the low level in a state with the signal a1 being at the high level and the inverted signal a1n being at the low level, the output signal Q of the waiting circuit 100C maintains the low level and the output signal Qn maintains the high level. In other words, the second transfer signal d11 is at the low level and the inverted signal d11n is at the high level at the time t6. The first transfer signal d10 is at the low level and the inverted signal d10n is at the high level.

(e) At time t7, the reply signal a2 corresponding to 'data=0' transferred to the second circuit block B2 is transferred from the second circuit block B2 to the data transfer circuit 1. In other words, the reply signal a2 changes to the high level and the output signal Q of the waiting circuit 100C changes to the low level. At time t8, the first transfer signal d20 changes to the low level. In other words, the time periods t3 through t8 define a period during which 'data=0' is transferred from the output circuit 20.

(f) At time t8, since the first transfer signal d20 and the second transfer signal d21 are at the low level, the signal a1 changes to the low level and the inverted signal a1n changes to the high level. Since the signal a1 changes to the low level and the inverted signal a1n changes to the high level with the second transfer signal d01 being at the high level, the output signal Q of the waiting circuit 100B changes to the high level and the output signal Qn changes to the low level. As a result, the second transfer signal d11 changes to the high level and the inverted signal d11n changes to the high level. As a result, the reply signal a0 changes to the high level.

(g) At time t10, the second transfer signal d01 changes to the low level. In other words, the time periods t6 through t10 define a period during which 'data=1' is transferred from the first circuit block B1. Since the second transfer signal d01 changes to the low level with the signal a1 being at the low level and the inverted signal a1n being at the high level, the second transfer signal d11 maintains the high level and the inverted signal d11n maintains the high level.

(h) At time t11, the reply signal a2 changes to the low level. In other words, the time periods t7 through t11 define a period during which the second circuit block B2 transfers the reply signal a2 corresponding to transfer of 'data=0'.

(i) Since the reply signal a2 changes to the low level with the second transfer signal d11 being at the high level and the inverted signal d11n being at the low level, the output signal Q of the waiting circuit 100D changes to the high level and the output signal Qn changes to the low level. In other words, at time t12, the second transfer signal d21 changes to the high level. As a result, the signal a1 changes to the high level and the inverted signal a1n changes to the low level.

(j) Since the signal a1 changes to the high level and the inverted signal a1n changes to the low level with the second transfer signal d01 being at the low level, the output signal Q of the waiting circuit 100B changes to the low level and the output signal Qn changes to the high level. In other words, at the time t13, the second transfer signal d11 changes to the low level and the inverted signal d11n changes to the high level. As a result, the reply signal a0 changes to the low level. The time periods t9 through t13 define a period during which 'data=1' is transferred from the input circuit 10.

(k) At time t14, the reply signal a2 corresponding to 'data=1' transferred to the second circuit block B2 is transferred from the second circuit block B2 to the data transfer circuit 1. The reply signal a2 changes to the high level and the output signal Q of the waiting circuit 100D changes to the low level. In other words, at time t15, the second transfer signal d21 changes to the low and the time periods t12 through t15 define a period during which 'data=1' is transferred from the output circuit 20.

(l) At time t15, since the first transfer signal d20 and the second transfer signal d21 are at the low level, the signal a1 changes to the low level and the inverted signal a1n changes to the high level. In other words, the data transfer circuit 1 returns to the state of time t0.

The time periods t5 through t6 and the time periods t13 through t16 are periods during which both the first transfer signal d00 and the second transfer signal d01 are at the low level and data is not transferred from the first circuit block B1 to the second circuit block B2.

As described above, with the data transfer circuit 1 shown in FIG. 1, data is transferred from the first circuit block B1 to the second circuit block B2 in response to the reply signal a2 transferred from the second circuit block B2. In other words, once the reply signal a2 changes to the low level and the data just transferred is confirmed to have been transferred to the second circuit block B2, subsequent data is then transferred.

Therefore, data transfer between the first circuit block B1 and the second circuit block B2, differing in clock frequency, is possible. The data transfer circuit 1 transfers 1-bit long data from the first circuit block B1 to the second circuit block B2. Therefore, a data transfer circuit 1 that can accommodate a data length for transferring a plurality of bit-long data can be prepared.

In addition, as already mentioned, in the case where the waiting circuit 100 shown in FIG. 2 is used as the waiting circuits 100A through 100D shown in FIG. 1, regardless of the high level voltage of the input signal, the waiting circuits 100A through 100D transfer a signal for which the voltage Vd1 or the voltage Vd2 to be applied to the waiting circuits 100A through 100D is defined as the high level. More specifically, the first transfer signal d10, the inverted signal d10n, the second transfer signal d11, and the inverted signal d11n for which the voltage Vd1 is defined as the high level, are transferred as the respective first transfer signal d20, the inverted signal d20n, the second transfer signal d21, and the inverted signal d21n for which the voltage Vd2 is defined as the high level, from the output circuit 20 to the second circuit block B2. Furthermore, the reply signal a2 with the voltage Vd2 as the high level is transferred as the reply signal a0 with the voltage Vd1 as the high level to the first circuit block B1.

In other words, the data transfer circuit 1 has a signal level changing function. Therefore, in the case where the voltage Vd1 of the first high voltage power source line 301 is less than the voltage Vd2 of the second high voltage power source line 302, or in the case where the voltage Vd1 of the first high voltage power source line 301 is greater than the voltage Vd2 of the second high voltage power source line 302, data transfer between the first circuit block B1 and the second circuit block B2 is possible.

With the data transfer circuit 1 according to the first embodiment of the present invention, data is transferred between the input circuit 10 and the output circuit 20, by using the first transfer signal d10 and the inverted signal d10n thereof, and the second transfer signal d11 and the inverted signal d11n thereof. By using the first transfer signal d10 and the inverted signal d10n thereof for transferring data, it is possible to apply the waiting circuit 100 shown in FIG. 2 as the waiting circuit 100A and the waiting circuit 100C. In addition, by using the second transfer signal d11 and the inverted signal d11n thereof for transferring data, it is possible to apply the waiting circuit 100 as the waiting circuit 100B and the waiting circuit 100D. It is possible to implement data transfer between the first circuit block B1 and the second circuit block B2, differing in power supply voltage and clock frequency, by applying waiting circuit 100 as the waiting circuits 100A through 100D. Furthermore, the waiting circuit 100 has a function of converting signal levels of input signals. Therefore, a level converter is unnecessary. As a result, according to the data transfer circuit 1 shown in FIG. 1, an increase of transfer loop may be controlled, and throughput of data transfer is improved.

<Modification>

Figure 5:
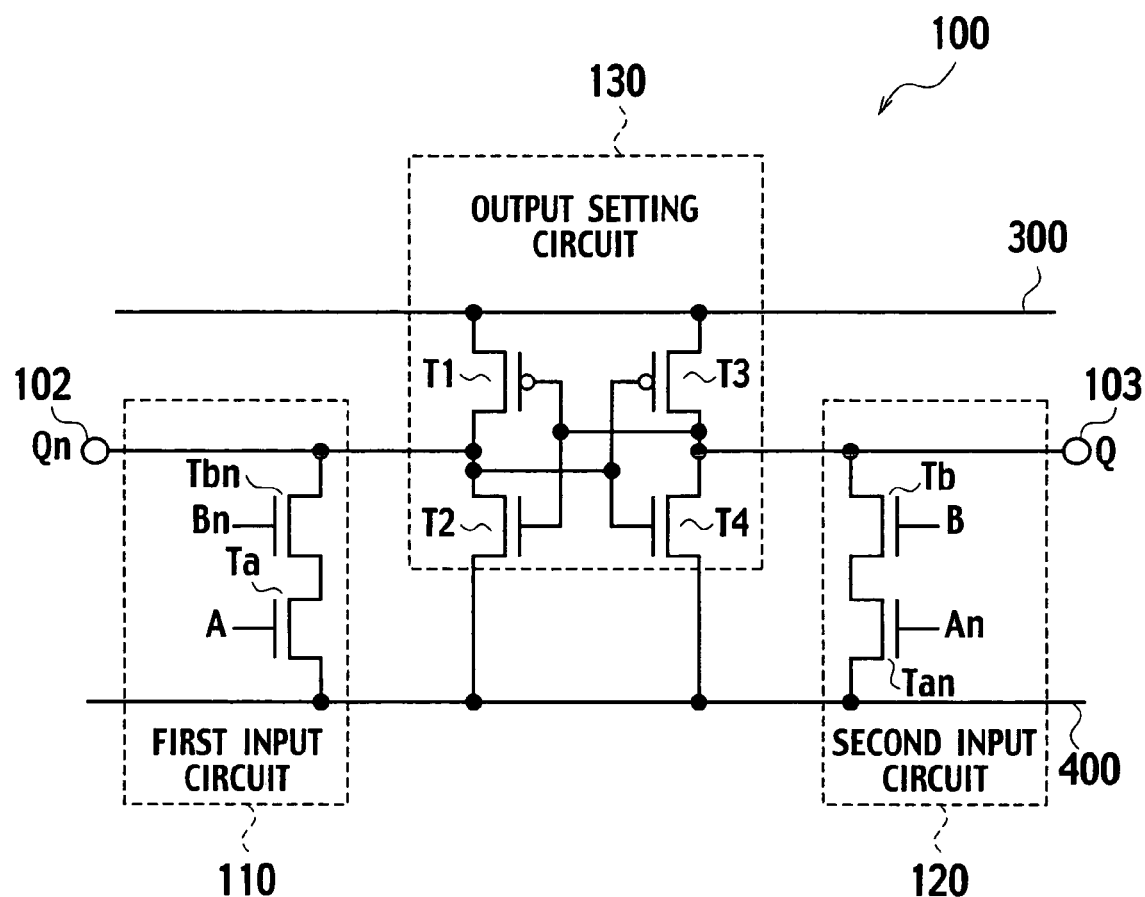
FIG. 5 is a schematic diagram showing a waiting circuit of a data transfer circuit according to a modification example of the first embodiment of the present invention.

FIG. 5 shows a waiting circuit 101 according to a modification of the first embodiment of the present invention. The waiting circuit 101 differs from the waiting circuit 100 shown in FIG. 2 in that the blocking circuit 140 is not included. As shown in FIG. 5, the source electrode of the second setting transistor T2 and the source electrode of the fourth setting transistor T4 are connected to the low voltage power supply line 400. Since the waiting circuit 101 does not include the blocking circuit 140, a leakage current, which flows from the output terminal 103 and the output terminal 102 to the low voltage power source line 400 when the voltage of either the output terminal 103 or the output terminal 102 is at the high level, cannot be reduced. However, with the waiting circuit 101, circuit area and power consumption are reduced more than with the waiting circuit 100. In other words, use of the waiting circuit 101 as the waiting circuits 100A through 100D reduces circuit area and power consumption of the data transfer circuit 1 shown in FIG. 1.

Second Embodiment

Figure 6:
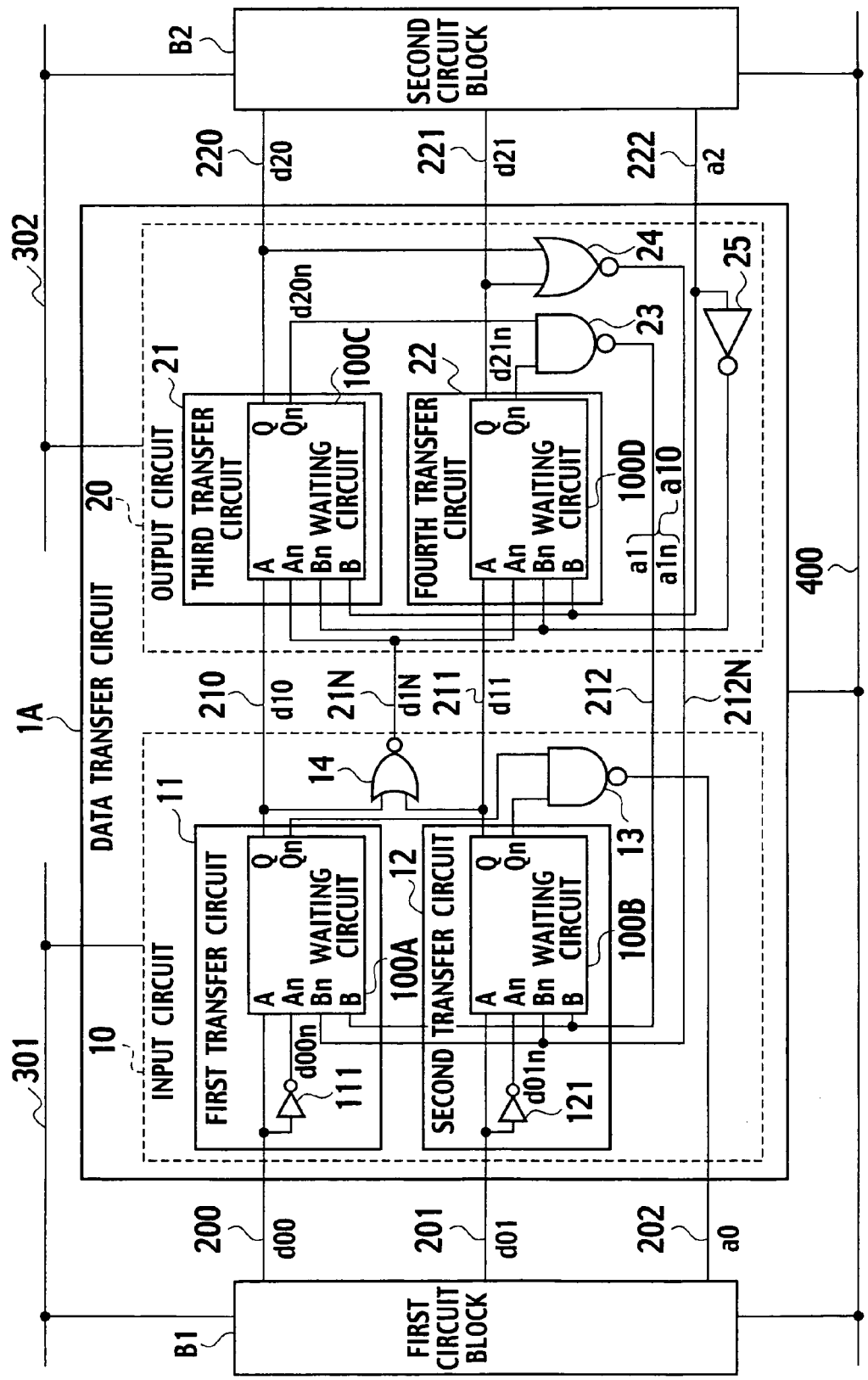
FIG. 6 is a schematic diagram showing a data transfer circuit according to a second embodiment of the present invention.

A data transfer circuit 1A according to a second embodiment of the present invention differs from that shown in FIG. 1 in that it includes a NOR circuit 14. A first transfer signal d10 and a second transfer signal d11 enter the NOR circuit 14, as shown in FIG. 6. The output of the NOR circuit 14 is transfers through a signal line 21N to transfer to a third transfer circuit 21 and a fourth transfer circuit 22. Furthermore, the data transfer circuit 1A shown in FIG. 6 does not include the interconnect 210N connected to the first transfer circuit 11 and the third transfer circuit 21, and the interconnect 211N connected to the second transfer circuit 12 and the fourth transfer circuit 22 included in the data transfer circuit 1 of FIG. 1. The other elements are the same as that of the first embodiment shown in FIG. 1.

Figure 7:
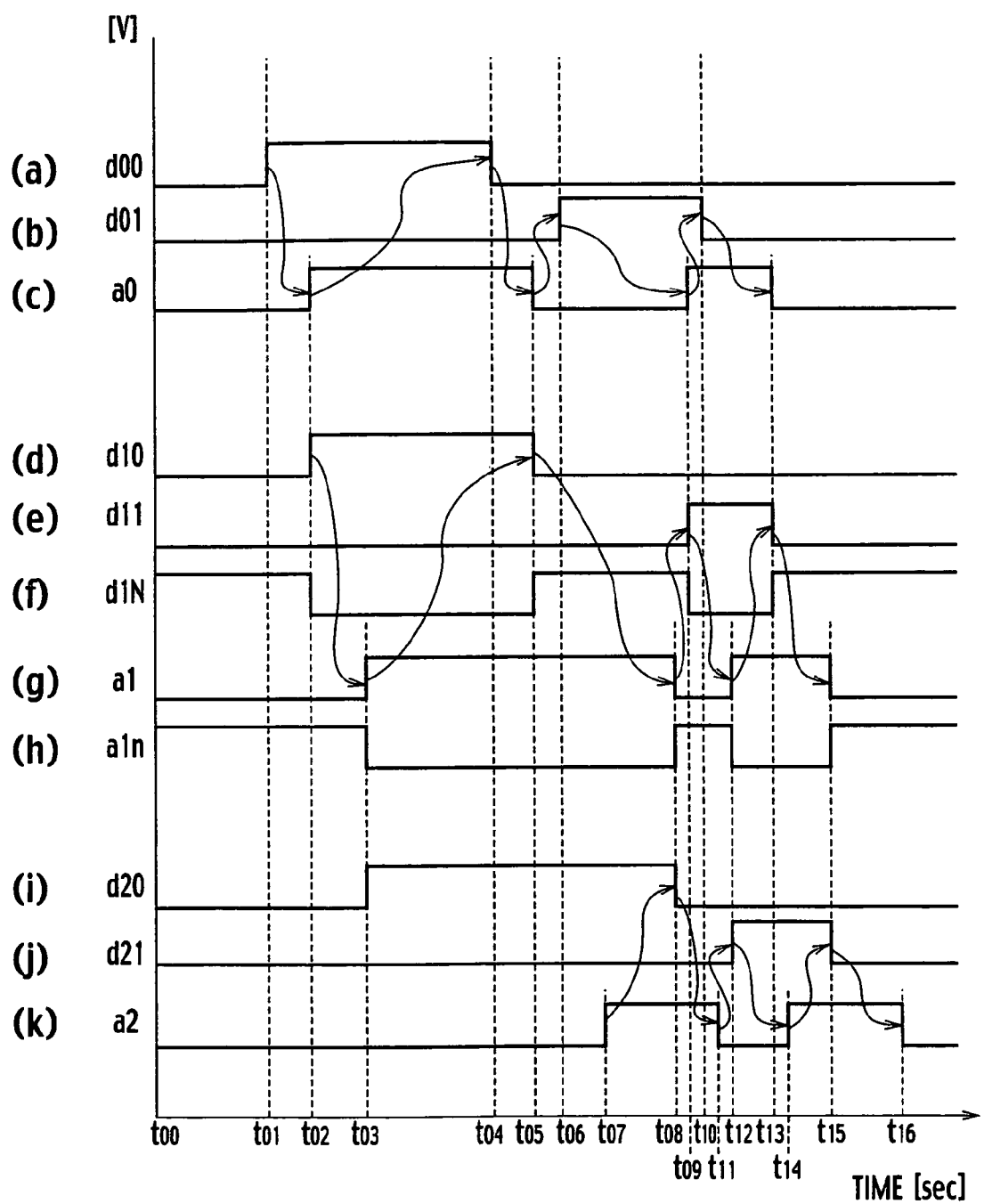
FIG. 7 is a timing chart explaining an operation of the data transfer circuit according to the second embodiment of the present invention.

An inverted signal d1N, which is an output signal of the NOR circuit 14, is transferred to a waiting circuit 100C and a waiting circuit 100D via the signal line 21N of FIG. 6. In other words, the inverted signal d1N is a combined signal of the inverted signal d10$n$ and the inverted signal d11$n$. FIG. 7 shows a timing chart for an operation of the data transfer circuit 1A shown in FIG. 6.

As shown in FIG. 7, at the time periods t2 through t5 or a period during which 'data=0' is transferred from an input circuit 10, the inverted signal d1N is equivalent to the inverted signal d10$n$ of the first transfer signal d10 shown in FIG. 4. Therefore, at the time periods t2 through t5, the waiting circuit 100C of FIG. 6 carries out the same operation as the waiting circuit 100C of FIG. 1. At the time periods t2 through t5, both the second transfer signal d11 and the inverted signal d1N transferred to the waiting circuit 100D shown in FIG. 6 are at a low level. In other words, at the time periods t2 through t5, the levels of the inverted signal d1N and the inverted signal d11$n$ differ. However, at the time periods t2 through t5 during which 'data=0' is transferred, the state of the waiting circuit 100D does not change regardless of the level of the inverted signal d11$n$. In other words, even if the inverted signal d11$n$ transferred to the waiting circuit 100D is replaced by the inverted signal d1N, the operations of the data transfer circuit 1 of FIG. 1 and the data transfer circuit 1A of FIG. 6 are the same.

Furthermore, as shown in FIG. 7, at time periods t9 through t13 or a period during which 'data=1' is transferred from the input circuit 10, the inverted signal d1N is equivalent to the inverted signal d11$n$ of the second transfer signal d11 shown in FIG. 4. Therefore, at the time periods t9 through t13, the waiting circuit 100D of FIG. 6 carries out the same operation as the waiting circuit 100D of FIG. 1. At the time periods t9 through t13, both the first transfer signal d10 and the inverted signal d1N transferred to the waiting circuit 100C shown in FIG. 6 are at the low level. In other words, at the time periods t2 through t5, the levels of the inverted signal d1N and the inverted signal d10$n$ differ. However, at the time periods t9 through t13 during which 'data=1' is transferred, the state of the waiting circuit 100C does not change regardless of the level of the inverted signal d10$n$. In other words, even if the inverted signal d10$n$ transferred to the waiting circuit 100C is replaced by the inverted signal d1N, the operations of the data transfer circuit 1 of FIG. 1 and the data transfer circuit 1A of FIG. 6 are the same.

As described above, use of the combined inverted signal d1N of the inverted signal d10$n$ and the inverted signal d11$n$ allows the data transfer circuit 1A of FIG. 6 to carry out the same data transfer as the data transfer circuit 1 of FIG. 1.

The data transfer circuit 1A according to the second embodiment of the present invention reduces the number of signal lines connecting the input circuit 10 and the output circuit 20. Since the remainder of the operation is substantially the same as that of the first embodiment, repetitive description thereof is omitted.

Various modifications will become possible for those skilled in the art after receiving the teachings of the present disclosure without departing from the scope thereof.

What is claimed is:

1. A data transfer circuit configured to transfer data between a first circuit block and a second circuit block, the second circuit block operating at a power supply voltage different from a power supply voltage for the first circuit block, the data transfer circuit comprising:

a first transfer circuit configured to receive a first transfer signal from the first circuit block;

a second transfer circuit configured to receive a second transfer signal from the first circuit block;

a third transfer circuit configured to receive the first transfer signal transmitted from the first transfer circuit, and an inverted first transfer signal from the first transfer circuit, and transfer the first transfer signal to the second circuit block in response to a reply signal from the second circuit block; and a fourth transfer circuit configured to receive the second transfer signal transmitted from the second transfer circuit, and an inverted second transfer signal from the second transfer circuit, and transfer the second transfer signal to the second circuit block in response to the reply signal, wherein a transfer control signal is generated from the first transfer signal and the inverted first transfer signal, both of which are transferred from the third transfer circuit, and the second transfer signal and the inverted second transfer signal, both of which are transferred from the fourth transfer circuit;

the first transfer circuit transmits the first transfer signal and the inverted first transfer signal in response to the transfer control signal;

the second transfer circuit transmits the second transfer signal and the inverted second transfer signal in response to the transfer control signal; and a reply signal is generated to be transferred to the first circuit block using the inverted first transfer signal transmitted from the first transfer circuit and the inverted second transfer signal transmitted from the second transfer circuit.

2. The circuit of claim 1, wherein each of the first through the fourth transfer circuits comprises a waiting circuit comprising:

a first input circuit including:

a first input transistor configured to receive one of the first and second transfer signals; and a first negative input transistor cascaded to the first input transistor, configured to receive one of inverted reply and transfer control signals;

a second input circuit including:
  a second negative input transistor configured to receive one of the inverted first and second transfer signals; and
  a second input transistor cascaded to the second negative input transistor, configured to receive one of the reply and transfer control signals; and
an output setting circuit configured to set a level of an output signal in accordance with a conductive status of the first and the second input circuit:
wherein channels for the first input transistor, the second input transistor, the first negative input transistor, and the second negative input transistor are all of a first conductivity type.

3. The circuit of claim 2, wherein the first input transistor, the second input transistor, the first negative input transistor, and the second negative input transistor are n-channel MOS transistors.

4. The circuit of claim 2, wherein the output setting circuit comprises:
  a first setting transistor with a second conductivity type channel, including:
    a drain electrode connected to the first input circuit; and
    a gate electrode connected to the second input circuit;
  a second setting transistor with the first conductivity type channel, including:
    a drain electrode connected to the first input circuit; and
    a gate electrode connected to the second input circuit;
  a third setting transistor with the second conductivity type channel, including:
    a gate electrode connected to the first input circuit; and
    a drain electrode connected to the second input circuit; and
  a fourth setting transistor with the first conductivity type channel, including:
    a gate electrode connected to the first input circuit; and
    a drain electrode connected to the second input circuit.

5. The circuit of claim 4, wherein the first setting transistor and the third setting transistor are p-channel MOS transistors, and the second setting transistor and the fourth setting transistor are n-channel MOS transistors.

6. The circuit of claim 4, wherein the output setting circuit further comprises a blocking circuit configured to reduce leakage current flow from the output setting circuit to a power source line.

7. The circuit of claim 6, wherein the blocking circuit comprises:
  a fifth setting transistor with the first conductivity type channel, including:
    a drain electrode connected to the source electrode of the second setting transistor; and
    a source electrode connected to the power source line:
    wherein the fifth setting transistor receives the same signal as a signal received by the first input transistor;
  a sixth setting transistor with the first conductivity type channel, including:
    a drain electrode connected to the source electrode of the second setting transistor; and
    a source electrode connected to the power source line:
    wherein the sixth setting transistor receives the same signal as a signal received by the first negative input transistor;
  a seventh setting transistor with the first conductivity type channel, including:
    a drain electrode connected to the source electrode of the fourth setting transistor; and
    a source electrode connected to the power source line:
    wherein the seventh setting transistor receives the same signal as a signal received by the second input transistor; and
  an eighth setting transistor with the first conductivity type channel, including
    a drain electrode connected to the source electrode of the fourth setting transistor; and
    a source electrode connected to the power source line:
    wherein the eighth setting transistor receives the same signal as a signal received by the second negative input transistor.

8. The circuit of claim 4, wherein the source electrodes of the first setting transistor, the second setting transistor, the third setting transistor, and the fourth setting transistor are respectively connected to a power source line.

9. The circuit of claim 1, wherein a power source voltage applied to the first and the second transfer circuits is the same as a power source voltage applied to the first circuit block, and a power source voltage applied to the third and the fourth transfer circuit is the same as a power source voltage applied to the second circuit block.

10. The circuit of claim 1, wherein clock frequencies of the first circuit block and the second circuit block differ from each other.

11. The circuit of claim 10, wherein the first and the second transfer circuit operate in synchronization with a clock frequency of the first circuit block, and the third and the fourth transfer circuit operate in synchronization with a clock frequency of the second circuit block.

12. The circuit of claim 1, wherein at least one of the first circuit and second circuit blocks is an asynchronous circuit.

13. The circuit of claim 1, wherein 1-bit data is transferred from the first circuit block to the second circuit block via the first and second transfer signals.

14. The circuit of claim 2, wherein the first transfer circuit further comprises an inverter configured to invert the first transfer signal and transfer the inverted first transfer signal to the second negative input transistor.

15. The circuit of claim 2, wherein the second circuit further comprises an inverter configured to invert the second transfer signal and transfer the inverted second transfer signal to the second negative input transistor.

16. The circuit of claim 1, further comprising:
  a NAND circuit configured to receive the inverted first transfer signal transferred from the first transfer circuit and the inverted second transfer signal transferred from the second transfer circuit, and transfer the reply signal to the first circuit block.

17. The circuit of claim 1, further comprising:
  a NOR circuit configured to receive the first transfer signal transferred from the third transfer circuit and second transfer signal transferred from the fourth transfer circuit, and transfer an inverted transfer control signal to the first and second transfer circuits; and
  a NAND circuit configured to receive the inverted first transfer signal transferred from the third transfer circuit and the inverted second transfer signal transferred from the fourth transfer circuit, and transfer the transfer control signal to the first and the second transfer circuit.

18. The circuit of claim 1, further comprising an inverter configured to invert the reply signal transferred from the second circuit block, and transfer the inverted reply signal to the third and fourth transfer circuits.

19. The circuit of claim 1, further comprising:
a NOR circuit configured to receive the first transfer signal transmitted from the first transfer circuit and the second transfer signal transmitted from the second transfer circuit, and transfer the output to the third and fourth transfer circuits.

* * * * *